United States Patent
Lee

(10) Patent No.: US 7,495,918 B2
(45) Date of Patent: Feb. 24, 2009

(54) PLASMA DISPLAY DEVICE

(75) Inventor: Yuju Lee, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 11/717,660

(22) Filed: Mar. 14, 2007

(65) Prior Publication Data

US 2007/0230132 A1    Oct. 4, 2007

(30) Foreign Application Priority Data

Mar. 29, 2006    (KR)            10-2006-0028656

(51) Int. Cl.
     *H05K 7/20*          (2006.01)
     *H01L 23/427*     (2006.01)

(52) U.S. Cl. .................. 361/707; 361/704; 361/719; 165/80.3; 165/104.33; 165/185; 428/40.1; 428/408; 174/51; 174/68.1; 174/254; 349/58; 349/59; 349/60; 349/151; 313/40; 313/45; 313/46

(58) Field of Classification Search .................. 361/681, 361/683, 688, 689, 700, 702–712, 719, 807, 361/816, 831; 165/80.3, 104.33, 185; 313/40, 313/45, 46, 493, 573, 582, 634, 294, 581, 313/48, 583; 345/1.3, 8, 98, 87, 156, 204, 345/102, 158, 169, 905; 349/59; 348/836
See application file for complete search history.

(56) References Cited

U.S. PATENT DOCUMENTS

| | | | | |
|---|---|---|---|---|
| 6,982,874 | B2 * | 1/2006 | Smalc et al. | 361/704 |
| 7,160,619 | B2 * | 1/2007 | Clovesko et al. | 428/408 |
| 7,166,912 | B2 * | 1/2007 | Tzeng et al. | 257/712 |
| 7,276,273 | B2 * | 10/2007 | Clovesko et al. | 428/40.1 |
| 7,282,842 | B2 * | 10/2007 | Kim et al. | 313/46 |
| 7,303,820 | B2 * | 12/2007 | Capp et al. | 428/408 |
| 7,306,847 | B2 * | 12/2007 | Capp et al. | 428/408 |
| 7,345,878 | B2 * | 3/2008 | Kim | 361/703 |
| 7,372,704 | B2 * | 5/2008 | Jeong | 361/719 |
| 2005/0194900 | A1 * | 9/2005 | Kim et al. | 313/582 |
| 2007/0062676 | A1 * | 3/2007 | Yao | 165/104.33 |

FOREIGN PATENT DOCUMENTS

| | | |
|---|---|---|
| KR | 10-2005-0039218 | 4/2005 |
| KR | 10-2005-0104582 | 11/2005 |

\* cited by examiner

*Primary Examiner*—Michael V Datskovskiy
(74) *Attorney, Agent, or Firm*—Robert E. Bushnell, Esq.

(57) ABSTRACT

A plasma display having improved heat sink efficiency and reduced manufacturing cost includes a heat sink member made of an inexpensive graphite material having excellent thermal conductivity instead of a more expensive aluminum protective plate or a heat sink plate. The heat sink member serves as a heat sink of a Tape Carrier Package (TCP), an Intelligent Power Module (IPM), and other elements producing considerable amounts of heat.

20 Claims, 5 Drawing Sheets

PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on the 29 Mar. 2006 and there duly assigned Serial No. 10-2006-0028656.

BACKGROUND OF THE INVENTION

1. Field of the Invention

The present invention relates to a plasma display, and more particularly, the present invention relates to a plasma display having improved heat sink efficiency and reduced manufacturing cost by including a heat sink for a Tape Carrier Package (TCP), or an Intelligent Power Module (IPM), etc., the heat sink being made of inexpensive graphite material having excellent thermal conductivity instead of an aluminum protective plate or a heat sink plate.

2. Description of the Related Art

A plasma display is a flat panel type display using a Plasma Display Panel (PDP). The PDP is produced by forming a plurality of electrodes on two substrates that are opposite to each other, arranging the substrates so as to be spaced apart from each other by a constant distance, and then sealing the substrates together after injecting discharge gases therebetween.

The plasma display includes the PDP and a plurality of drivers that are connected to each of the electrodes of the PDP.

Each pixel in the PDP is represented by a discharge in a pixel region. The discharge is generated by supplying a voltage to electrodes within a pixel space, so that a plasma or an excited state atom is produced. The power required for the discharge is partly dissipated as light, but mostly as heat.

The material of phosphors for forming the PDP have a disadvantage in that they are easily deteriorated and changed at high temperature, and their life shortened. By overheating, especially partial overheating in the PDP, a glass substrate can break due to stress caused by thermal expansion thereof.

The drivers, which are connected to the electrodes of the PDP, also dissipate a considerable amount of power in order to display a screen. The power dissipation results in thermal production. As a result, if the drivers are overheated, they can cause faulty operation. This faulty operation can cause deterioration in the quality of the screen. For example, a discharge can occur at a pixel which should not be discharged. Accordingly, it is very important to effectively radiate heat produced from the driver in the PDP. Since a considerable amount of heat is produced from a driving chip of the TCP, it is difficult to cool the driving chip if it does not contact a separate heat sink.

Usually, a chassis base, which is attached to a second surface of the PDP, is used to radiate heat from a heat generation part, such as the PDP and the drivers, to the outside. The chassis base is typically constituted by coupling a chassis-reinforcing member to a plate-type chassis base. The chassis-reinforcing member prevents deformation of the chassis base caused by external forces, and prevents the bending of the chassis base when the PDP is deformed by heat. As a result thereof, the deformation of the PDP may be also prevented. A driver for driving the PDP is arranged on a plurality of circuit substrates and mounted together with a power supply. The circuit substrate is usually spaced a constant distance apart from the chassis base through a boss, which is formed on the chassis base, in order for the ventilation of air.

The chassis base reinforces the mechanical strength by supporting the PDP and simultaneously receives heat from the PDP and the driver, which are in contact with the chassis base, and radiates the received heat to the outside. Additionally, the chassis base equally distributes the partly concentrated heat. For this reason, the chassis base is made of a metal, such as aluminum (Al), having excellent thermal conductivity.

However, the TCP and Chip On Film (COF) connect between the electrodes connected to the pixels of the PDP and drivers for driving the electrodes and have a built-in driving chip. Accordingly, a cooling problem of the driving chip occurs. Furthermore, an Intelligent Power Module (IPM) mounted on a driving board on a second surface of the chassis base includes a power transistor in one package, a protection circuit for protecting the power transistor, and a driving circuit for driving the power transistor. As a result thereof, the IPM produces a considerable amount of heat, and thus its cooling problem occurs.

Usually, a protection plate is mounted on an upper part of the TCP in order to protect the TCP and server as a heat sink of the TCP. The protection plate is usually made of aluminum. A protection plate made of aluminum has a disadvantage in that it is expensive and thus a manufacturing cost thereof is increased. Furthermore, a heat sink plate is mounted on an upper part of the IPM in order to serve as the heat sink of the IPM. The heat sink plate is also made of aluminum like the protection plate. Therefore, the protection plate made of aluminum has a disadvantage in that it is expensive and thus the manufacturing cost thereof is increased.

SUMMARY OF THE INVENTION

Accordingly, an object of the present invention is to provide a plasma display that has improved heat sink efficiency and reduced manufacturing cost by including a heat sink made of inexpensive graphite material having excellent thermal conductivity instead of an aluminum protective plate or a heat sink plate, for a TCP, or an IPM, etc., each of which produces a considerable amount of heat.

According to one aspect of the present invention, a plasma display is provided including: a Plasma Display Panel (PDP) to display images on a first surface thereof, the images being generated by a gas discharge; a chassis base arranged on a second surface of the PDP, the chassis base supporting the PDP; a driving circuit substrate arranged on the second surface of the chassis base; a Tape Carrier Package (TCP) having at least one element mounted on a connection cable electrically coupling the driving circuit substrate to the PDP; and a heat sink member arranged on the second surface of the TCP and contacting the at least one element, the heat sink member including a graphite layer, a holder to support the graphite layer, and a coating layer covering an area including a surface of the graphite layer opposite to the at least one element.

The chassis base preferably includes a chassis reinforcing member, the at least one element being supported by the chassis reinforcing member. The chassis base preferably includes a bent part on an end thereof, the at least one element being supported by the bent part.

The holder preferably surrounds part of the graphite layer.

A vertical end surface of the holder preferably has a "⊏" shape having a fixing groove on one surface thereof, the graphite layer being supported by being inserted into the fixing groove. The holder preferably includes a material selected from a group consisting of an iron alloy, aluminum alloy and stainless steel alloy.

The coating layer preferably covers a surplus area except for an area where the graphite layer is surrounded by the holder. The coating layer preferably entirely covers a surface of the graphite layer. The coating layer preferably includes an elastic layer having a better elastic force than that of the graphite layer.

The elastic layer preferably includes a material selected from a group consisting of a paint coating layer, a thermal grease layer and a plastic coating layer.

The graphite layer is preferably supported by being affixed to the holder by an adhesive agent layer.

A thermally conductive medium is preferably interposed between the chassis reinforcing member and the at least one element.

According to another aspect of the present invention, a plasma display is provided including: a Plasma Display Panel (PDP) to display images on a first surface, the images being generated by a gas discharge; a chassis base arranged on a second surface of the PDP, the chassis base supporting the PDP; a driving circuit substrate arranged on the second surface of the chassis base and including an Intelligent Power Module (IPM); and a heat sink member arranged on the second surface of the IPM and contacting the IPM, the heat sink member including a graphite layer, a holder to support the graphite layer, and a coating layer covering an area of the graphite layer including a surface opposite to the IPM.

The holder preferably surrounds a part of the graphite layer. A vertical end surface of the holder preferably has a "

" shape having a fixing groove on one surface, the graphite layer being supported by being inserting into the fixing groove. The holder preferably includes a material selected from a group consisting of iron alloy, aluminum alloy and stainless steel alloy.

The coating layer preferably covers a surplus area except for an area where the graphite layer is surrounded by the holder. The coating layer preferably entirely covers the surface of the graphite layer. The coating layer preferably includes an elastic layer having a better elastic force than that of the graphite layer.

The elastic layer preferably includes a material selected from a group consisting of a paint coating layer, a thermal grease layer and a plastic coating layer.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 6b is a perspective view of a scan driving board of FIG. 6a; and

DETAILED DESCRIPTION OF THE INVENTION

Figure 1:
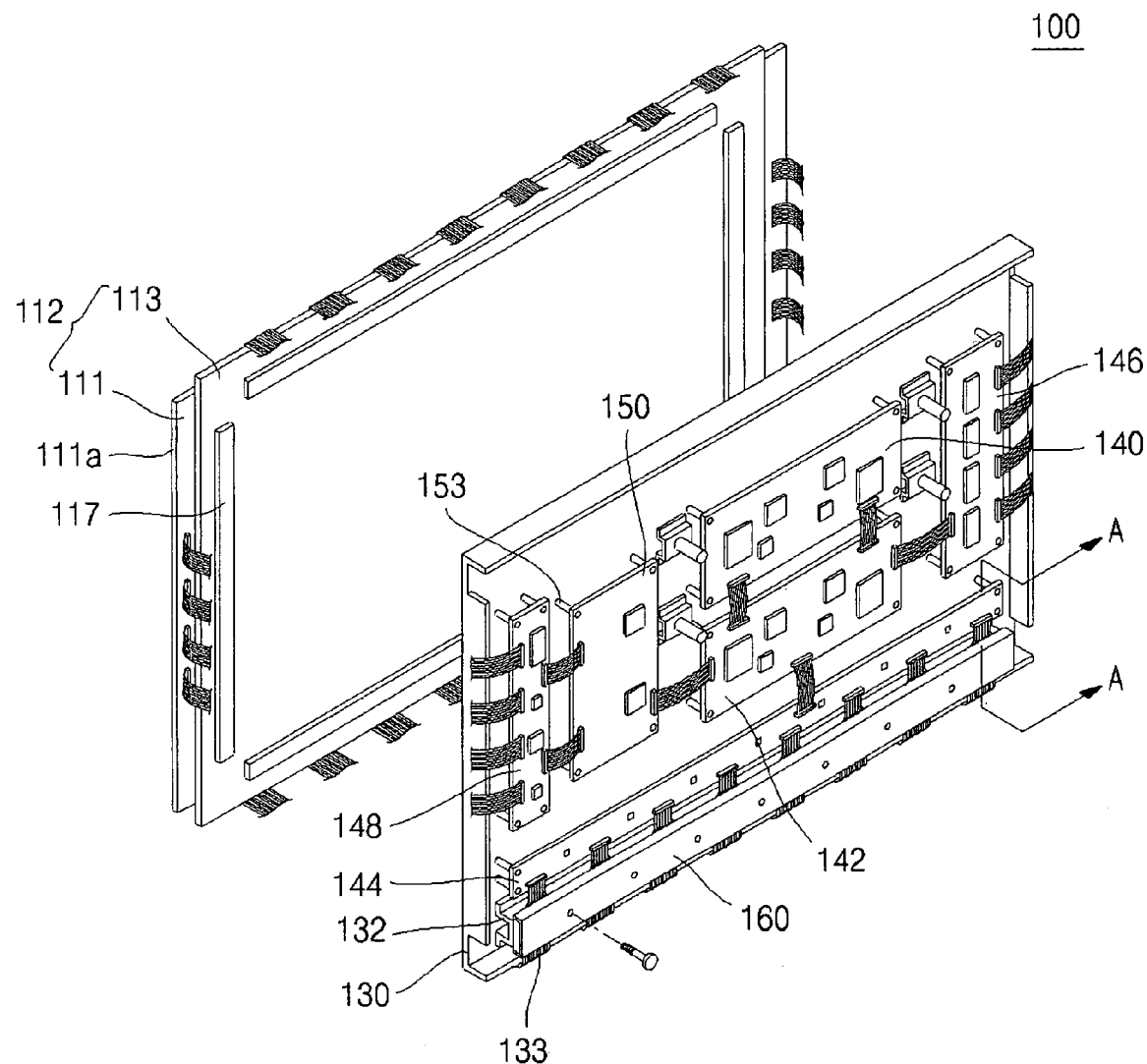
FIG. 1 is a perspective view of a plasma display according to an exemplary embodiment of the present invention.

Hereinafter, exemplary embodiments of the present invention are described in detail with reference to the accompanying drawing. The aspects and features of the present invention and methods for achieving the aspects and features will be apparent by referring to the embodiments described in detail with reference to the accompanying drawings. However, the present invention is not limited to the embodiments disclosed hereinafter, but can be implemented in diverse forms. The matters defined in the description, such as the detailed construction and elements, are merely specific details provided to assist those of ordinary skill in the art in a comprehensive understanding of the present invention, and the present invention is only defined within the scope of the appended claims. In the entire description of the present invention, the same drawing reference numerals are used for the same elements across various figures.

Figure 2:
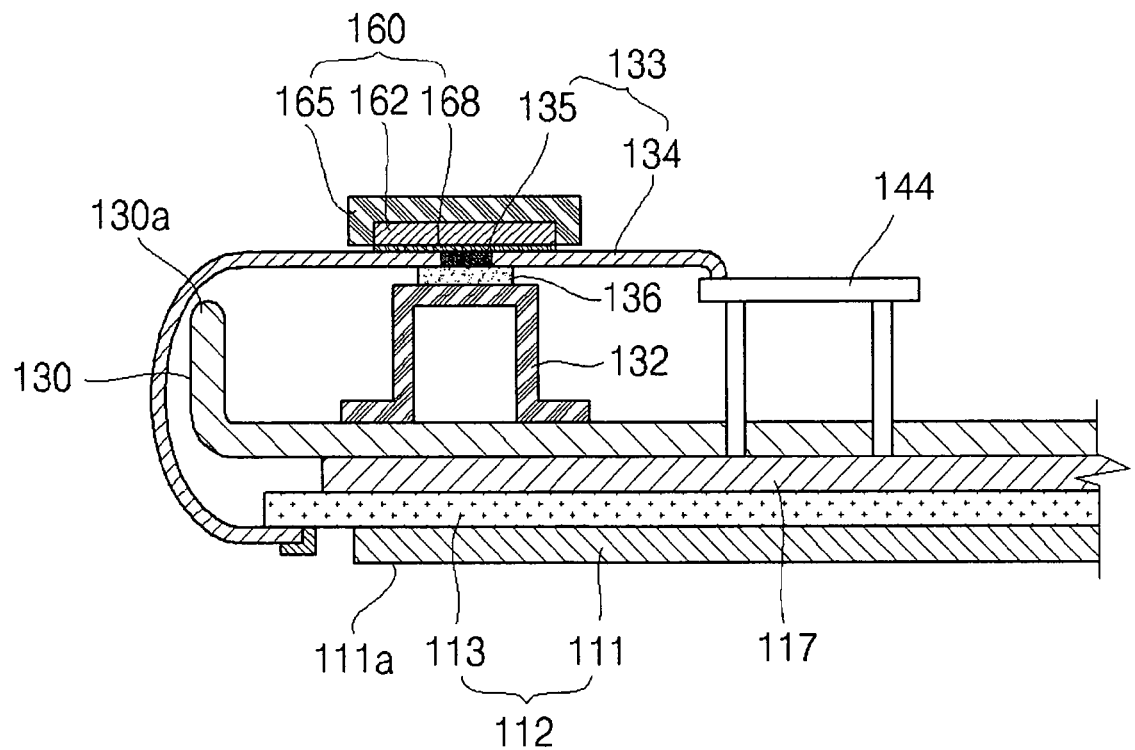
FIG. 2 is a vertical cross-sectional view taken along "A-A" line of FIG. 1.

FIG. 1 is a perspective view of a plasma display according to an exemplary embodiment of the present invention, and FIG. 2 is a vertical cross-sectional view taken along "A-A" line of FIG. 1.

Referring to FIGS. 1 and 2, the plasma display 100 according to the embodiment of the present invention includes a PDP 112 including a front panel 111 and a rear panel 113, a chassis base 130 for supporting the PDP 112 at the second surface of the PDP 112, and a plurality of driving circuit substrates 140, 142, 144, 146, 148 and 150. A driving circuit is formed by mounting a plurality of electronic circuit boards on the driving circuit substrates 140, 142, 144, 146, 148 and 150. Additionally, the plasma display includes a TCP 133 for electrically coupling apart of the driving circuit substrates 140, 142, 144, 146, 148 and 150 to an element 134 that is mounted on the TCP 133. The plasma display 100 is in contact with the element 134 and includes a heat-sink 160 for rapidly radiating heat produced by the element 134.

The PDP 112 includes a discharge cell (not shown) formed by a barrier rib between the front panel 111 and the rear panel 113 and a phosphor layer (not shown) formed within the discharge cell. The front panel 111 includes a plurality of display electrodes (not shown) having a straight line form and arranged horizontally parallel to each other. The rear panel 113 includes a plurality of address electrodes (not shown) having a straight line form and arranged vertically parallel to each other. The PDP 112 displays an image using a gas discharge that occurs inside a discharge cell due to a voltage supplied sequentially to the address electrodes and display electrodes on the first surface 111a of the front panel 111. Hereinafter, the first surface 111a of the front panel 111 is the side of the front panel 111 displaying an image on PDP 112, and the second surface is the side of the front panel 111 opposite to the first surface 111a.

The chassis base 130 is attached to the second surface of the rear panel 113 to support the PDP 112. The chassis base 130 is usually made of metal, preferably aluminum having excellent thermal conductivity and a relatively high mechanical strength. The chassis base 130 may be made of various materials, such as metal alloys, engineering plastics, etc. However, the present invention is not limited thereto. The chassis base 130 further includes a chassis reinforcing member 132 for preventing the bending and deformation of the chassis base 130 at the second surface thereof. The chassis reinforcing member 132 is formed on the second surface of the chassis base 130 so as to reinforce the strength of the chassis base 130. The chassis reinforcing member 132 is manufactured separately from the chassis base 130 and attached to the chassis base 130 with screws, for example. The chassis reinforcing member 132 may be also formed together with the chassis base 130 as one body. Preferably, the chassis reinforcing member 132 is made of metal, more preferably aluminum material having excellent thermal conductivity and relatively high mechanical strength. The chassis reinforcing member 132 can be made of various materials, such as metal alloys. However, the present invention is not limited thereto. The chassis base 130 is fixed by supporting the PDP 112 by a double-sided tape 117 that is affixed to the second surface of the rear panel 113. A thermal spread sheet (not shown) together with the double-sided tape 117 is interposed between the chassis base 130 and the rear panel 113. The thermal spread sheet is formed of a carbon material having excellent thermal conductivity so as to transfer heat produced from the PDP 112 to the chassis base 130. Furthermore, the chassis base 130 has an end part 130a touching a connect cable 134 in order to prevent damage to the connect cable 134.

The plurality of driving circuit substrates 140, 142, 144, 146, 148 and 150 are arranged on the second surface of the chassis base 130. The plurality of driving circuit substrates 140, 142, 144, 146, 148 and 150 are provided with a driving chip and electric/electronic devices, all of which are required to drive the PDP.

A lead-out electrode (not shown), which is connected to an address electrode and a sustain electrode, is arranged on a circumference of the PDP 112 that is attached in front of the chassis base 130. The lead-out electrode is connected to the driving circuit substrate by the TCP 133.

The TCP 133 is a package where an element 135 is mounted in the connect cable 134 made of a Flexible Printed Circuit (FPC). The connect cable 134 of the TCP 133 is arranged outside the PDP 112 and the chassis base 130. The ends of the connect cable 134 are respectively electrically coupled to the driving circuit substrate and the PDP 112. The element 135 is mounted on and electrically coupled to the connect cable 134. The element 135 also includes elements, such as the driving chip for driving the PDP 112. The element 135 is supported by and fixed to the chassis reinforcing member 132. The element 135 may be supported by directly contacting the chassis reinforcing member 132. The element 135 radiates a considerable amount of heat while the plasma display 100 is operating. The heat produced by the element 135 deteriorates the driving chip itself as well as the electronic circuit elements mounted on the driving circuit substrate. Therefore, there is a need to effectively radiate heat produced by the element 135. A thermally conductive medium 136 may be formed between the chassis reinforcing member 132 and the element 135 in order to effectively radiate heat produced by the element 135. Thermal grease, graphite, and the like, can be used as the thermally conductive medium 136. The heat produced by the element 135 may be radiated by being transferred to the chassis reinforcing member 132, and by being sequentially transferred to the thermally conductive medium 136 and the chassis reinforcing member 132. The heat transferred to the chassis reinforcing member 132 may be radiated by being transferred back to the chassis base 130.

The heat sink member 160 includes a graphite layer 162, a holder 165 and a coating layer 168. The heat sink member 160 is arranged to contact the entire area of the element 135 constituting the TCP 133. The heat sink member 160 contacts the element 135 so as to effectively radiate heat produced by the element 135.

The graphite layer 162 is formed as a thin lamella having a predetermined thickness, preferably at least 0.9 mm. However, the present invention is not limited thereto. The graphite layer 162 has a width and length covering an area in which the element of the TCP 133 is located, so that the element of the TCP 133 is wholly covered. Additionally, the graphite layer 162 has a wider area than that in contact with the element 135 in order to effectively radiate heat produced from the element 135.

The graphite of the graphite layer 162 has a high thermal conductivity, i.e., approximately double the thermal conductivity of aluminum, so as to effectively radiate heat from the element 135. The graphite layer 162 has a lamellar molecule structure, so that the thermal conductivity in a horizontal direction is higher than that in a vertical direction. Accordingly, even when the graphite layer 162 is formed to be thinner, the heat produced by the element 135 is dispersed at a very high speed and radiated to the outside, or transferred to the holder 165. Additionally, the graphite layer 162 is less expensive than aluminum, and thus the manufacturing costs are decreased by using the graphite layer 162 instead of an aluminum protection plate.

The graphite layer 162 may be tightly in contact with the element 135 by an elastic force, and absorbs vibration produced by the element 135. A heat sink characteristic of the graphite layer 162 is affected by a substantial contact area between the graphite layer 162 and a surface of the element 135. The graphite layer 162 has the elastic force, and thus more effectively radiates heat from the element 135 when it is in contact with the element 135 by a predetermined pressure. Accordingly, the graphite layer 162 is formed to be in contact with the element 135 by providing the predetermined pressure via the holder 165.

The holder 165 is formed to surround a part of the graphite layer 162, and support the graphite layer 162 at the second surface of the graphite layer 162, i.e., an opposite direction to first surface of the graphite layer 162 in contact with the element 135. The holder 165 is in contact with a second surface of the graphite layer 162 to support the graphite layer 162, and may be in contact with a side surface including the second surface to support the graphite layer 162. Furthermore, the holder 165 may be formed to surround two side surfaces, an upper/lower surface and a rear side surface. In other words, the holder 165 may be formed to surround an entire side surface of the graphite layer 162, except for a surface in contact with the element 135. The holder 165 may be formed into a square box shape that is provided with a fixing groove 165a on one surface thereof. That is, a vertical end surface of the holder 165 may be formed into "⊏" shape. The graphite layer 162 is fixed by being inserted into the fixing groove 165a.

If the holder 165 is formed into the "⊏" shape, it is possible to prevent the pressure on the element 135 being decreased due to an internal deformation caused by high heat for a long time. The holder 165 have higher strength than the material of the graphite layer 162, is formed of a metal having a thermal conductivity, such as a steel alloy, aluminum alloy, stainless steel alloy, etc. Accordingly, the holder 165 supports the graphite layer 162 and has stiffness, so as to maintain the contact between the graphite layer 162 and the element 135. The holder 165 is coupled to the chassis reinforcing member 132 or the chassis base 130 using fasteners, such as screws, etc. Additionally, the holder 165 may be formed by pressing or by casting. However, the present invention is not limited thereto.

The coating layer 168 is formed to predetermined thickness on an outer surface of the graphite layer 162 in order to prevent dust from being produced by the graphite layer 162. The graphite layer 162 is formed of graphite, thereby allowing fine dust particles to be produced during an installation process or when using the plasma display. This graphite dust has a high electrical conductivity according to characteristics of the graphite material, and thus can induce an electrical short when it is attached to the TCP 133 or other circuit board. The coating layer 168 is formed on a surplus surface except for a surface to be surrounded by the holder 165 within the outer surface of the graphite layer 162, so as to be coated on the graphite layer 162 that is exposed to the outside.

The coating layer 168 may be formed of a material having a good elastic force as compared to the graphite layer 165. The coating layer 168 directly contacts the element 135, and thus can more effectively absorb the vibration produced by the element 135, since it has better elastic force than the graphite layer 165. When being formed as an elastic layer, the coating layer 168 may be a paint coating layer, a thermal grease layer or a plastic coating layer. However the present invention is not limited thereto. The coating layer 168 may be formed of various materials that have a higher elastic force than that of the graphite layer 162.

A plasma display according to another embodiment of the present invention is explained in detail below.

Figure 3:
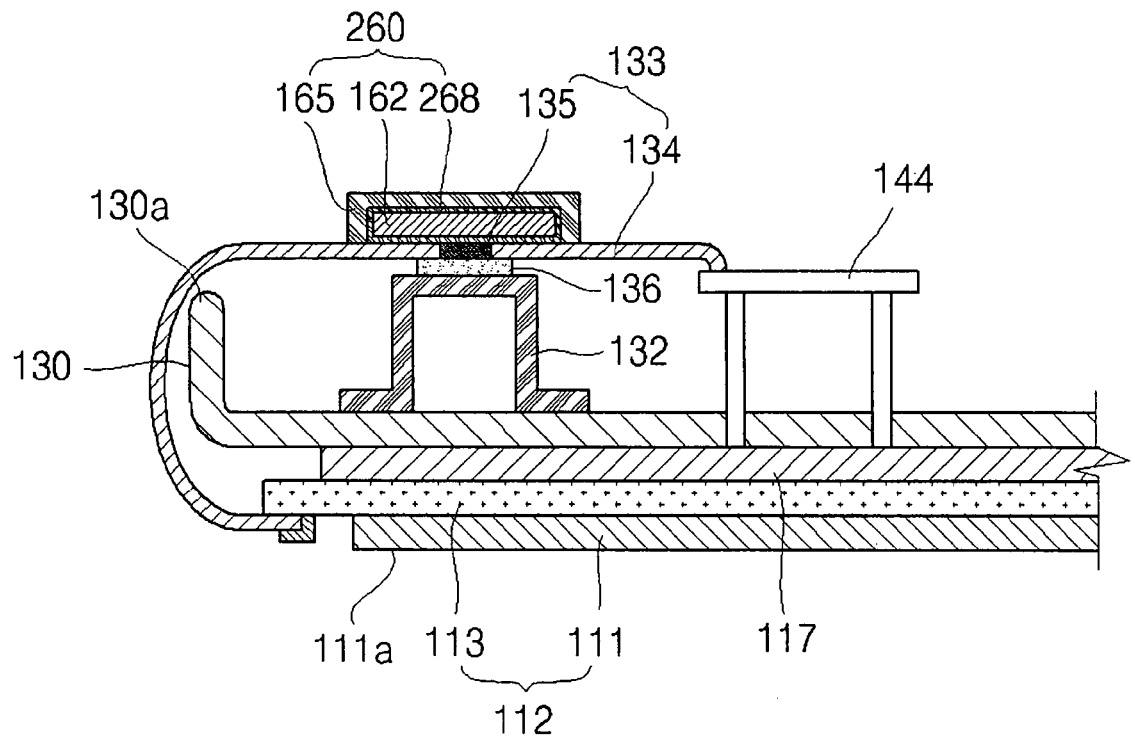
FIG. 3 is a vertical cross-sectional view of a corresponding part of FIG. 2 of a plasma display according to another embodiment of the present invention.

FIG. 3 is a vertical cross-sectional view for a heat sink member used in a plasma display according to another embodiment of the present invention.

Hereinafter, the plasma display according to another embodiment of the present invention will be explained focusing on a part which is different from that of the embodiments of FIGS. 1 and 2. In other words, the plasma display according to another embodiment of the present invention is the same as that according to the embodiments of FIGS. 1 and 2, except for the heat sink member. Accordingly, an overall explanation for the plasma display according to another embodiment of the present invention has been omitted hereinafter, and the following explanation focusing on the heat sink member. Furthermore, the same reference numerals are used for the same or similar elements, and detailed descriptions of the same elements has been omitted.

The plasma display according to another embodiment of the present invention includes a PDP 112, a chassis base 130, a plurality of driving circuit substrates 140, 142, 144, 146, 148, and 150, and a heat sink member 260.

Referring to FIG. 3, the heat sink member 260 includes a graphite layer 162, a holder 165 and a coating layer 268. The heat sink member 160 is in contact with the entire area of the element 135 constituting the TCP 133 so as to effectively radiate heat produced by the element 135.

The coating layer 268 coats the entire outer surface of the graphite layer 162 and effectively prevents graphite dust from being produced by the graphite layer 162. The coating layer 268 may have a higher elastic force than that of the graphite layer 162.

Next, a plasma display according to still another embodiment of the present invention is explained in detail as follows.

Figure 4:
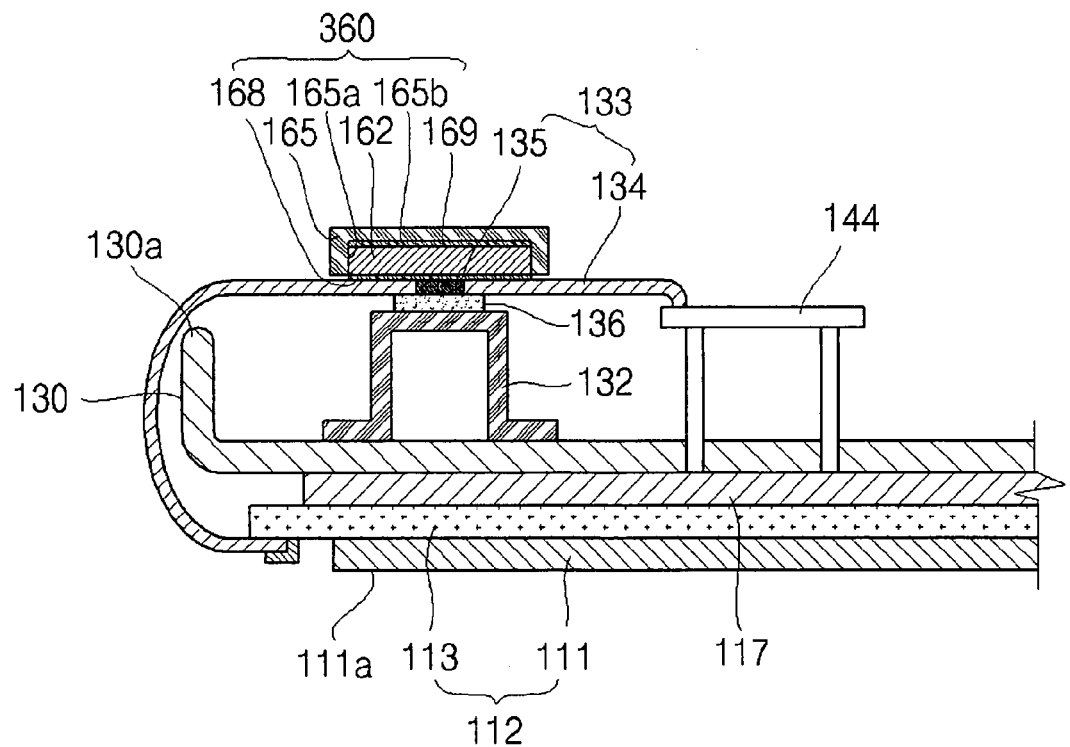
FIG. 4 is a vertical cross-sectional view of a corresponding part of FIG. 2 of a plasma display according to still another embodiment of the present invention.

FIG. 4 is a vertical cross-sectional view of a heat sink member used in the plasma display according to still another embodiment of the present invention.

Hereinafter, the plasma display according to still another embodiment of the present invention is explained focusing on a part which is different from that of the embodiments of FIGS. 1 and 2. In other words, the plasma display according to still another embodiment of the present invention is the same as that according to the embodiments of FIGS. 1 and 2, except for the heat sink member. Accordingly, an overall explanation for the plasma display according to still another embodiment of the present invention has been omitted hereinafter, and the explanation focusing on the heat sink member. Furthermore, the same reference numerals are used for the same or similar elements, and detailed descriptions of the same elements have been omitted.

The plasma display according to still another embodiment of the present invention includes a PDP 112, a chassis base 130, a plurality of driving circuit substrates 140, 142, 144, 146, 148, and 150, and a heat sink member 360.

Referring to FIG. 4, the heat sink member 360 includes a graphite layer 162, a holder 165, a coating layer 168 and an adhesive agent layer 169. The heat sink member 160 is in contact with the entire area of the element 135 constituting the TCP 133, so as to effectively radiate heat produced by the element 135.

The adhesive agent layer 169 is formed inside a fixing groove 165a of a holder 165, preferably an area including a bottom area 165b. Accordingly, the element 135 may be more securely attached to the holder 165 by the adhesive agent layer 169. The adhesive agent layer 169 is a typically used adhesive agent. Preferably, the adhesive agent layer 169 may be formed as a thermally conductive adhesive agent having good thermal conductivity, and a thermal grease. If the adhesive agent layer 169 is a thermally conductive adhesive agent, it is possible to effectively radiate heat transferred to the graphite layer 162 toward the outside.

Next, a plasma display according to still another embodiment of the present invention is explained below.

Figure 5:
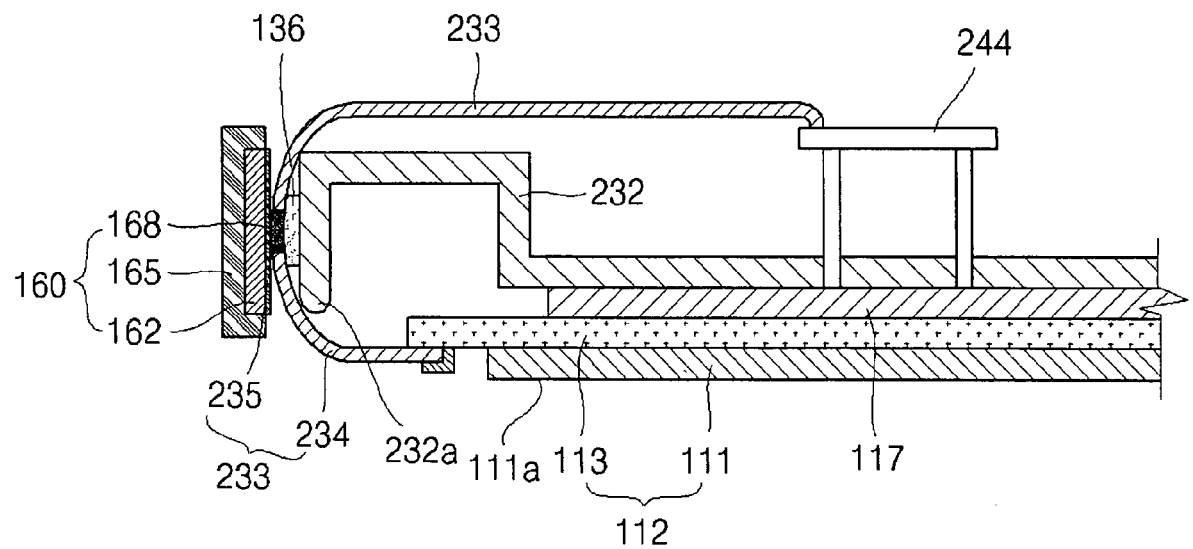
FIG. 5 is a partial vertical cross-sectional view of a corresponding part of FIG. 2 of a plasma display according to still another embodiment of the present invention.

FIG. 5 is a partial vertical cross-sectional view of the plasma display according to still another embodiment of the present invention.

Hereinafter, the plasma display according to another embodiment of the present invention is explained focusing on a part which is different from that of the embodiments of FIGS. 1 and 2. In other words, the plasma display according to still another embodiment of the present invention is the same as that according to the embodiments of FIGS. 1 and 2, except for a structure of the chassis base and a supporting location of the heat sink member. Accordingly, an overall explanation for the plasma display according to still another embodiment of the present invention has been omitted hereinafter, and the explanation focusing on the chassis base and the heat sink member. Furthermore, the same reference numerals are used for the same or similar elements, and detailed descriptions of the same elements have been omitted.

The plasma display according to still another embodiment of the present invention includes a PDP 112, a chassis base 230, a plurality of driving circuit substrates 140, 142, 144, 146, 148, and 150, and a heat sink member 160. The heat sink member 160 may use the heat sink member 260 of FIG. 3 or the heat sink member 360 of FIG. 4.

The chassis base 230 supports the PDP 112 at the second surface of the PDP 112. An end part of the chassis base 230 is bent in a "⊏" shape so as to form a bent part 232. The bent part 232 supports the element 135 at the outer surface thereof.

Referring to FIG. 5, the bent part 232 is formed by bending the end part of the chassis base 230 three times so as to enable the element 135 to be supported. However, the shape of the bent part to be formed at the end part of the chassis base 230 may be formed in various shapes capable of supporting the element 135. The present invention is not limited to the bent part 232 of FIG. 5. The chassis base 230 can form the bent part 232 on the end part thereof without a separate chassis reinforcing member. The bent part 232 forms the end part 232a touching the connect cable 234, so as to prevent the connect cable 234 from being damaged. The connect cable 234 is formed to be the same as the connect cable 134 of FIG. 1, except for the mounting location of the element 135. Accordingly, an explanation thereof has been omitted.

A thermally conductive medium 136 is formed between the bent part 232 and the element 135. The thermally conductive medium 136 may not be formed in some cases. In this case, the element 135 is supported by directly contacting the bent part 232.

Next, a plasma display according to still another embodiment of the present invention is explained as follows.

Figure 6A:
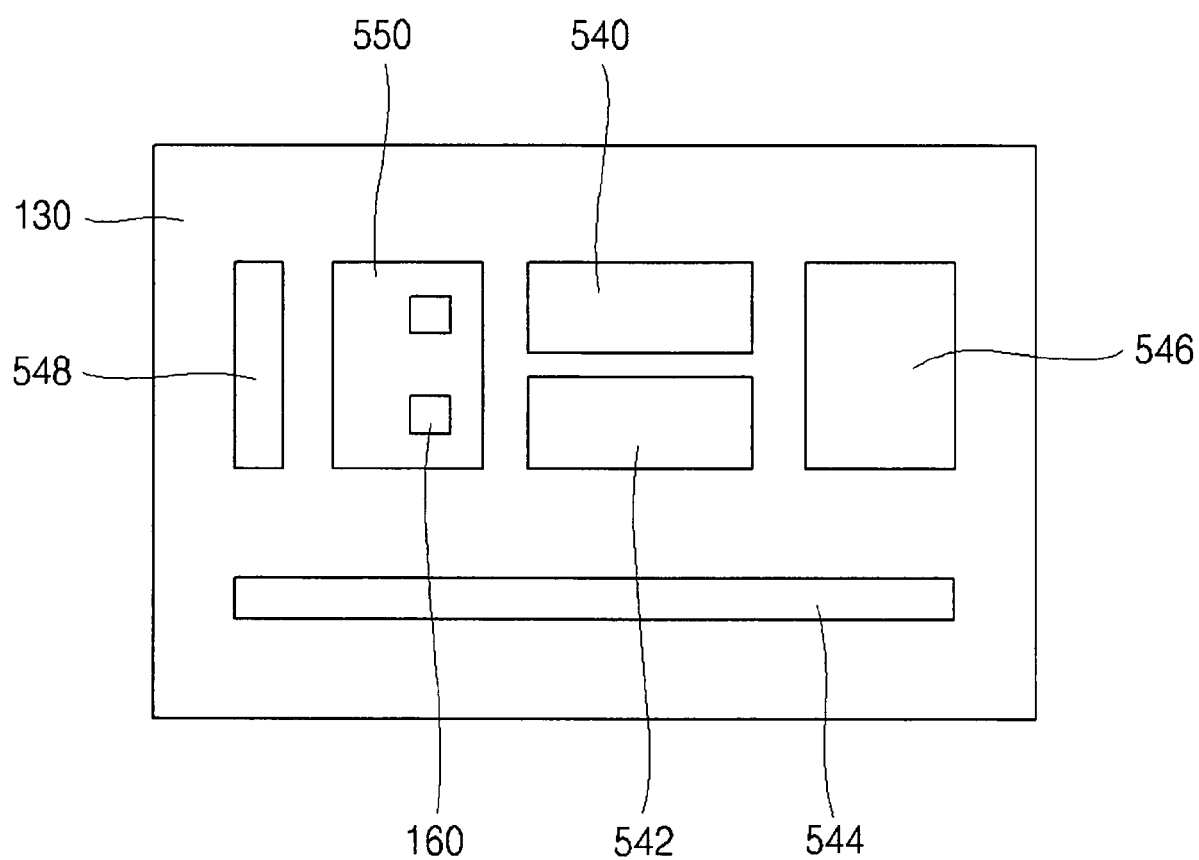
FIG. 6a is a plane view of an arrangement of a driving circuit substrate of a plasma display according to still another embodiment of the present invention.
Figure 6B:
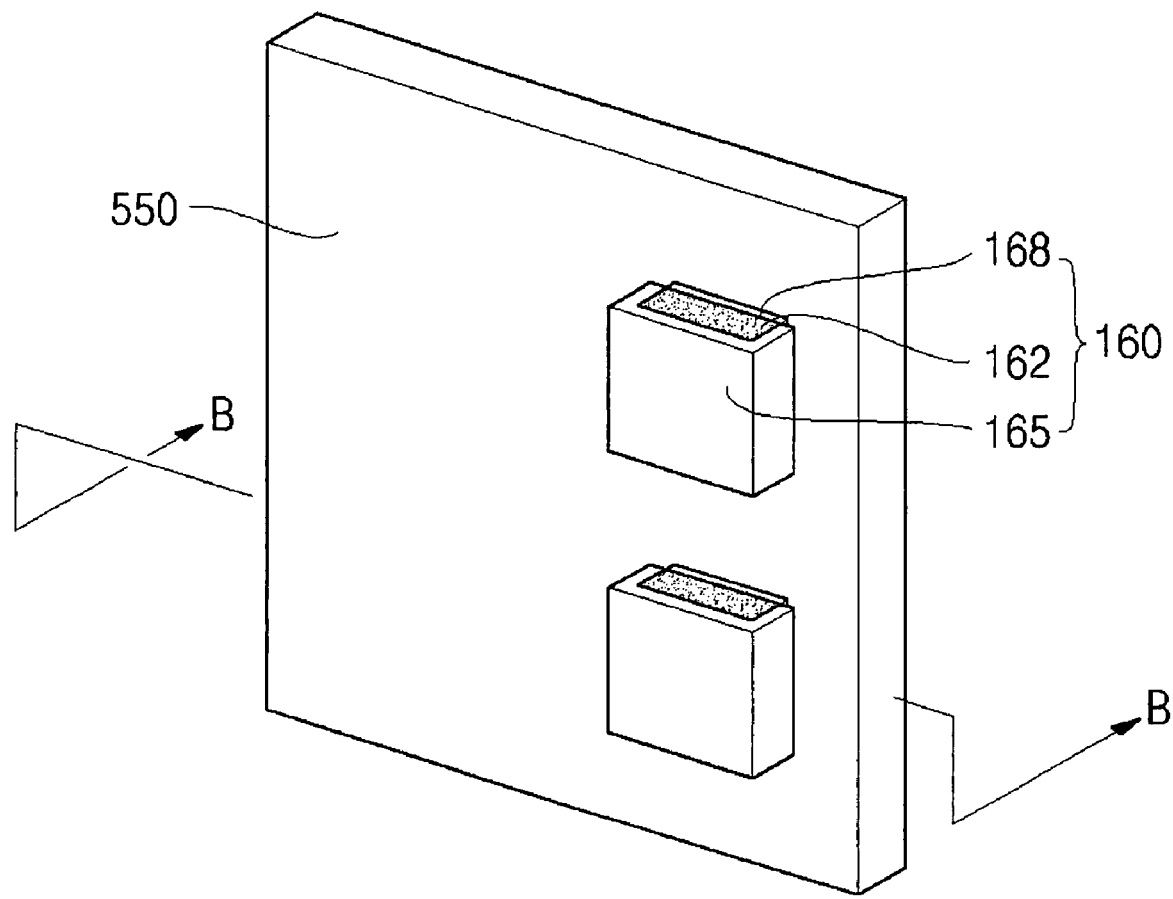

FIG. 6a is a plane view of an arrangement of a driving circuit substrate of a plasma display according to still another embodiment of the present invention. FIG. 6b is a perspective view of a scan driving board of FIG. 6a, and FIG. 6c is a cross-sectional view taken along "B-B" line of FIG. 6b.

Hereinafter, the plasma display according to still another embodiment of FIG. 6b is explained focusing on a part which is different from that of the embodiments of FIGS. 1 and 2. In other words, the plasma display according to still another embodiment of FIG. 6b is the same as that according to the embodiments of FIGS. 1 and 2, except that the heat sink member 160 is formed on a second surface of the IPM. Accordingly, an overall explanation for the plasma display according to still another embodiment of the present invention has been omitted hereinafter, and an explanation focusing on the chassis base and the heat sink member. Furthermore, the same reference numerals are used for the same or similar elements, and detailed descriptions of the same elements have been omitted.

The plasma display according to still another embodiment of the present invention includes a PDP 112, a chassis base 130, a plurality of driving circuit substrates 540, 542, 544, 546, 548, and 550, and a heat sink member 160. The heat sink member 160 can use the heat sink member 260 of FIG. 3 or the heat sink member 360 of FIG. 4.

Figure 6C:
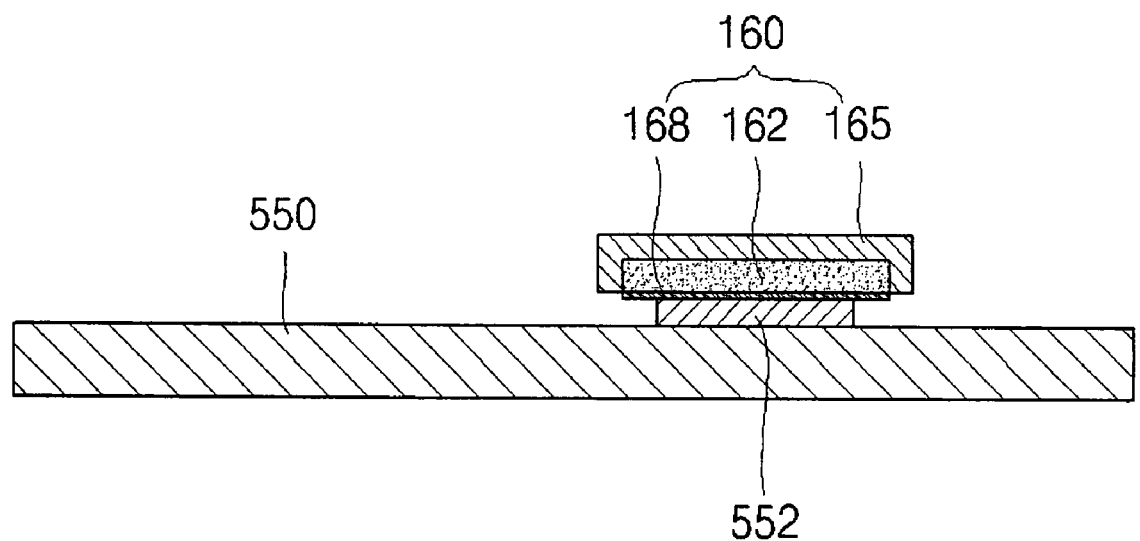
FIG. 6c is a cross-sectional view taken along "B-B" line of FIG. 6b.

Referring to FIGS. 6a to 6c, the driving circuit substrates 540, 542, 544, 546, 548 and 550 include a Switching Mode Power Supply (SMPS) 540, a logic board 542, an address buffer board 544, a sustain driving board 546, a scan buffer board 548 and a scan driving board 550, and are coupled to a second surface of the chassis base 130 through a boss (not shown) or the like. An arrangement of the driving circuit substrates 540, 542, 544, 546, 548 and 550 may be changed according to specification of the plasma display. A plurality of electronic circuit elements are mounted on the driving circuit substrates 540, 542, 544, 546, 548 and 550, and the IPM 552 is mounted on a part of the driving circuit substrates 540, 542, 544, 546, 548 and 550. For convenience of explanation, the IPM 552 formed on the scan driving board 550 will be explained below as an example. Accordingly, the following explanation can be applied to other driving circuit substrates on which the IPM 552 is mounted, except for the scan driving board 550.

The SMPS 540 may be located above the logic board 542, and is electrically coupled through the logic board 542, the address buffer board 544, the scan driving board 550 and the sustain driving board 546, and a Flexible Printed Circuit Board (FPC) or a Flexible Flat Cable (FFC). The SMPS 540 supplies power to a driving circuit and the PDP 112. The SMPS 540 is also equipped with an AC/DC converter that converts an Alternating Current (AC) current from an external source into a Direct Current (DC) current.

The address buffer board 544 is provided with an IPM, a timing controller, a plurality of signal input terminals, and a circuit portion for processing data. The address buffer board 544 may be formed on a lower part of the chassis base 330, as shown in FIG. 6a. One address buffer board 544 may also formed on an upper part of the chassis base 330, and two address buffer boards 544 may be respectively formed on the upper and lower parts one by one. However, the number of address buffer board 544 and the location thereof are not limited.

The scan buffer board 548 arranges data to be input to the scan electrode.

The plurality of electronic circuit elements including the IPM 552 are mounted on the scan driving board 550, and the thermal sink member 160 is affixed to the second surface of the IPM 552. For convenience of explanation, the electronic circuit elements except for the IPM 552 are not shown in FIGS. 6b and 6c. The scan driving board 550 is synchronized to a signal from the timing controller so as to generate a scan signal, and supplies the generated scan signal to a scan electrode. The scan driving board 550 may be electrically coupled through the SMPS 540, the address buffer board 544, the logic board 542 and the scan buffer board 548, and the FPC or the FFC. The electrical coupling may be differently formed according to the circuit design.

At least one IPM 552 is mounted on a predetermined area of the scan driving board 550. The IPM 552 is equipped with a power transistor, a protection circuit for protecting the power transistor and a driving circuit for driving the power transistor. Thus, since the IPM 552 produces a considerable amount of heat, it is very important to cool the IPM 552.

The heat sink member 160 is formed to cover the IPM 552. It is preferable for the heat sink member 160 to have a larger area than the IPM 552. Although not shown in the drawings, the heat sink member 160 may be coupled to the chassis base 130 (referring to FIGS. 1 and 2) using fasteners, such as screws, etc.

Next, an operation of the plasma display according to the present invention is explained as follows. For convenience of explanation, the embodiments of FIGS. 1 and 2 are explained below as an example.

The plasma display 100 includes the PDP 112, the chassis base 130, the driving circuit substrates 140, 142, 144, 146, 148 and 150, the TCP 133 and the thermal sink member 160.

If the heat is produced by the element 135 of the TCP 133, a part of the heat is transferred to the chassis reinforcing member 132 through the thermally conductive medium 136 touching the front of the element 135. Some of the heat transferred to the chassis reinforcing member is radiated by itself, others is radiated by being transferred to the chassis base 130.

The element 135 is supported by the thermal sink member 160 to maintain contact with the graphite layer 162. Accordingly, the element 135 transfers some of the produced heat to the graphite layer 162 touching the second surface of the element 135. The graphite layer 162 disperses the transferred heat in a horizontal direction within a short time interval so as to radiate most of the heat by itself, the remaining heat is transferred to the holder 165 touching the second surface thereof. The holder 165 radiates the transferred heat to the outside.

The heat sink member 160 forms a coating layer 168 between the graphite layer 162 and the element 135, in order to prevent an electrical short on the circuit substrate caused by graphite particles produced by the graphite layer 162.

If the coating layer 168 of the heat sink member 160 is formed as an elastic layer, the vibration produced by the element 135 can be absorbed.

As described above, the plasma display, according to the present invention, produces the following effect.

First, the plasma display uses a graphite layer having better heat conductivity than aluminum (Al) as the heat sink member, thereby allowing a considerable amount of heat produced by the TCP and/or IPM to be more rapidly radiated.

Second, the coating layer is formed on the outer surface of the graphite layer, thereby preventing electrical shorting of the circuit substrate due to graphite particles.

Third, the plasma display uses graphite as the heat sink member, the graphite being inexpensive as compared to aluminum, thereby allowing the manufacturing costs to be decreased.

The embodiments of the present invention have been described for illustrative purposes, and those skilled in the art will appreciate that various modifications, additions and substitutions are possible without departing from the scope of the present invention as defined by the appended claims.

What is claimed is:

1. A plasma display, comprising:
    a Plasma Display Panel (PDP) to display images on a first surface thereof, the images being generated by a gas discharge;
    a chassis base arranged on a second surface of the PDP, the chassis base supporting the PDP;
    a driving circuit substrate arranged on the second surface of the chassis base;
    a Tape Carrier Package (TCP) having at least one element mounted on a connection cable electrically coupling the driving circuit substrate to the PDP; and
    a heat sink member arranged on the second surface of the TCP and contacting the at least one element, the heat sink member including a graphite layer, a holder to support the graphite layer, and a coating layer covering an area including a surface of the graphite layer opposite to the at least one element.

2. The plasma display of claim 1, wherein the chassis base comprises a chassis reinforcing member, the at least one element being supported by the chassis reinforcing member.

3. The plasma display of claim 1, wherein the chassis base comprises a bent part on an end thereof, the at least one element being supported by the bent part.

4. The plasma display of claim 1, wherein the holder surrounds part of the graphite layer.

5. The plasma display of claim 1, wherein a vertical end surface of the holder is "C" shaped and has a fixing groove on one surface thereof, the graphite layer being supported by being inserted into the fixing groove.

6. The plasma display of claim I, wherein the holder comprises a material selected from a group consisting of an iron alloy, aluminum alloy and stainless steel alloy.

7. The plasma display of claim 1, wherein the coating layer covers a surplus area except for an area where the graphite layer is surrounded by the holder.

8. The plasma display of claim 1, wherein the coating layer entirely covers a surface of the graphite layer.

9. The plasma display of claim 1, wherein the coating layer comprises an elastic layer having a better elastic force than that of the graphite layer.

10. The plasma display of claim 9, wherein the elastic layer comprises a material selected from a group consisting of a paint coating layer, a thermal grease layer and a plastic coating layer.

11. The plasma display of claim 1, wherein the graphite layer is supported by being affixed to the holder by an adhesive agent layer.

12. The plasma display of claim 2, wherein a thermally conductive medium is interposed between the chassis reinforcing member and the at least one element.

13. A plasma display, comprising:
    a Plasma Display Panel (PDP) to display images on a first surface, the images being generated by a gas discharge;
    a chassis base arranged on a second surface of the PDP, the chassis base supporting the PDP;
    a driving circuit substrate arranged on the second surface of the chassis base and including an Intelligent Power Module (IPM); and
    a heat sink member arranged on the second surface of the IPM and contacting the IPM, the heat sink member including a graphite layer, a holder to support the graphite layer, and a coating layer covering an area of the graphite layer including a surface opposite to the IPM.

14. The plasma display of claim 13, wherein the holder surrounds a part of the graphite layer.

15. The plasma display of claim 13, wherein a vertical end surface of the holder is "C" shaped and has a fixing groove on one surface, the graphite layer being supported by being inserting into the fixing groove.

16. The plasma display of claim 13, wherein the holder comprises a material selected from a group consisting of iron alloy, aluminum alloy and stainless steel alloy.

17. The plasma display of claim 13, wherein the coating layer covers a surplus area except for an area where the graphite layer is surrounded by the holder.

18. The plasma display of claim 13, wherein the coating layer entirely covers the surface of the graphite layer.

19. The plasma display of claim 13, wherein the coating layer comprises an elastic layer having a better elastic force than that of the graphite layer.

20. The plasma display of claim 19, wherein the elastic layer comprises a material selected from a group consisting of a paint coating layer, a thermal grease layer and a plastic coating layer.

* * * * *